(12) United States Patent
Schulein et al.

(10) Patent No.: US 8,218,784 B2
(45) Date of Patent: Jul. 10, 2012

(54) DIGITAL AUDIO PROCESSOR DEVICE AND METHOD

(75) Inventors: Robert B. Schulein, Schaumburg, IL (US); Greg R. Shaw, Calgary (CA); David K Brown, Loveland, OH (US)

(73) Assignee: Tension Labs, Inc., Hoffman Estates, IL (US)

( * ) Notice: Subject to any disclaimer, the term of this patent is extended or adjusted under 35 U.S.C. 154(b) by 1127 days.

(21) Appl. No.: 12/008,252

(22) Filed: Jan. 9, 2008

(65) Prior Publication Data

US 2008/0181424 A1  Jul. 31, 2008

Related U.S. Application Data

(60) Provisional application No. 60/879,415, filed on Jan. 9, 2007.

(51) Int. Cl.
*H04R 1/10* (2006.01)

(52) U.S. Cl. ............................................. 381/74; 381/58

(58) Field of Classification Search ................... 381/58, 381/74
See application file for complete search history.

(56) References Cited

U.S. PATENT DOCUMENTS 7,817,803 B2 * 10/2010 Goldstein ...................... 381/56

* cited by examiner

*Primary Examiner* — Zandra Smith
*Assistant Examiner* — Paul Patton
(74) *Attorney, Agent, or Firm* — Bishop & Diehl, Ltd.

(57) ABSTRACT

An audio processor device and method is disclosed which measures and provides information relating to the audio level being applied to the ear of a user. The processor device uses a preset or calibrated sensitivity of the applied earphones in combination with an analysis of the audio stream to provide sound-pressure-level or time-weighted exposure information to the user or limit the output when preset levels have been achieved. Also disclosed is the use of microphones, internal or external, to combine an additional audio stream, typically the ambient environment, into the main audio channel.

44 Claims, 7 Drawing Sheets

| SPL dBA | Time |
|---|---|
| 85 | 8 Hours (480 Min.) |
| 88 | 4 Hours (240 Min.) |
| 91 | 2 Hours (120 Min.) |
| 94 | 1 Hour (60 Min.) |
| 97 | 30 Minutes |
| 100 | 15 Minutes |
| 103 | 7.5 Minutes |
| 106 | 3.75 Minutes |

DIGITAL AUDIO PROCESSOR DEVICE AND METHOD

CROSS-REFERENCE TO RELATED APPLICATIONS

This application claims the benefit of U.S. Provisional Patent Application Ser. No. 60/879,415, entitled DIGITAL AUDIO SYSTEM WITH SAFETY FEATURES, filed on Jan. 9, 2007.

TECHNICAL FIELD

The present invention is directed to a system and method for providing a user with information related to sound exposure from earphones or headphones, and in particular, to a digital audio processor that displays information regarding sound exposure within a human ear canal in response to an audio input.

BACKGROUND OF THE INVENTION

According to the National Institutes of Health, approximately 28 million Americans have a hearing impairment. Hearing loss covers an age span of approximately 17 in 1,000 children under the age of 18 and approximately 314 in 1,000 adults over the age of 65. This indicates that the incidence of hearing loss increases with age. In addition, ten million Americans have suffered irreversible noise-induced hearing loss, and 30 million more are exposed to dangerous sound levels each day.

One source of these dangerous sound levels is earphones and headphones. Generally, the user of earphones or headphones has no knowledge of or reference for the actual sound level presented to their ears. Without knowledge of the actual audio levels being applied to the ear canal, the user is at risk of accruing hearing damage with long-term use. With the increased use of insert-earphones (also know as in-ear earphones, isolating earphones, or canal-phones) and portable audio players, it is becoming more commonplace and understood that unsafe audio levels are being played and hearing damage is likely to occur. The Occupational Safety and Health Administration (OSHA) and other governmental and industry organizations have published sound-pressure-level versus exposure-time guidelines which indicate safe limits of exposure to noise.

In some instances, an earphone user may understand the risk involved in listening to sound at louder levels, but currently does not have a tool available for determining the level of sound to which he or she is actually being exposed. This problem is further exacerbated by the listening experience that is provided by noise-isolating or insert-earphones. In particular, a user of these earphones no longer has the reference of the ambient environment from which to determine the relative level of reproduced audio. In addition, the audio drivers of insert-earphones provide little of the bone-conduction vibration that bigger headphones or speakers create, which may lead the user into believing that the listening level is lower than actual.

One available method for protecting hearing is a volume limiter that is available on some portable audio devices. However, the protection offered by a Volume limiter is arbitrary because it limits the volume level based solely on the output of the instrument without taking into consideration the sensitivity of the earphones and how efficiently they couple sound to a user's eardrum. Thus, this method may cause the user to over or underestimate the levels of audio to which they are subject, and may provide a false sense of security. In addition, while it is understood that exposure to high sound-pressure-levels can be harmful to one's hearing, the duration of the exposure is key to understanding the relative level of danger. However, the volume limiter solution fails to take into account this duration to the exposure of the sound, which can further offer the user a false sense of protection.

SUMMARY OF THE INVENTION

A system and method is provided for measuring and displaying audio level information to an earphone or headphone user. In an embodiment, an audio processor device measures and displays the time-weighted average levels to which the earphone or headphone user has been exposed.

In another embodiment in accordance with the present invention, an audio processor device implements a measurement of and provides an indication of the audio presentation level of an earphone into the ear canal. The indication can take the form of a graph that shows the audio level as it changes with time input or the level can be indicated numerically, preferably in known units, for example, decibels (dB), or the indication can take the form of a series of colored lights or markers that progressively indicate the relative risk level. This indication is based on a calibration to the sensitivity of the earphones being used with the audio processor device. The calibration is entered into the audio processor device via the user interface and stored in memory. In an alternative embodiment, the calibration is performed using a potentiometer or gain switch. The indication can be displayed in decibels of sound-pressure-level (dB SPL) optionally with a weighing function applied, such as A, B, or C weighting.

In yet another embodiment in accordance with the present invention, an audio processor device provides the measurement and indication of the time-weighed noise (audio) exposure. In this embodiment, an indicator is employed that provides the user with knowledge of the amount of exposure to sound that is being or has been presented to the user's ears. This indication can give an overall exposure indication or can provide warnings to the user when a particular threshold of exposure has been exceeded.

In a further embodiment in accordance with the present invention, an audio processor device uses the measured sound-pressure level or the time-weighted exposure to limit the output of the audio stream. This function can be performed by a compression circuit to limit the dynamic-range or sound-pressure-levels, a limiter circuit that prevents the sound-pressure-level from exceeding a preset limit, or as an adaptive function that reduces the output when preset limits of exposure have been met.

In a further embodiment in accordance with the present invention, an integral microphone is provided with the audio processor that allows the introduction of ambient sound into the audio output. The output of the microphone can be either mixed with a separate audio program, or listened to independently. This audio signal allows the user to audibly interact with the environment while using sound-isolating earphones.

In still yet another embodiment in accordance with the present invention, the integral microphone is used to calibrate the sensitivity and/or frequency response of a user's earphones. An audio signal is supplied to the earphones and the response of the earphone measured through a known acoustical coupling volume or known acoustical coupling impedance by the integral microphone. The response as measured is then stored and can be used to provide the calibration for the sensitivity of the earphones. An audio signal such as a chirp or frequency sweep can be used as the source to the earphones in order to measure the transfer function of the earphones. The stored measurement can be used to implement a custom frequency equalization based on the actual frequency response of the earphone and a user-defined frequency response objective. One objective of the earphone calibration can be to normalize the earphone response to that of the frequency response at the tympanic membrane of an average human when exposed to a uniform diffuse sound field. In order to suitably represent the complex frequency dependent impedances of a nominal human ear canal, additional acoustic treatments, for example tuned acoustic dampers, can be used in the acoustical coupling volume. Compensations can also be implemented in the calibration software to assist in properly evaluating the response in view of the nominal human ear canal response.

In yet another embodiment in accordance with the present invention, the audio processor device uses stored calibration profiles for commonly known earphones. The sensitivity or frequency response of one or more earphones can be stored in the memory of the audio processor as supplied by the manufacturer or can be downloaded into the audio processor device through a computer connection, such as by means of a Universal Serial Bus (USB) connection or wireless USB connection. The earphone user can select the appropriate earphone profile from a selection through the user interface on the digital audio processor device or from a separate computer. The stored earphone can be used to set earphone frequency or amplitude characteristics that are appropriate for the user's earphones and the user's preferences.

In a further embodiment in accordance with the present invention, calibrated electronic equalization functions are provided with the audio processor device that allow the user to adjust the spectral aspects of sound reproduction using conventional bass and treble controls as well as a graphic equalizer, in a package no larger than 3.25 cubic inches.

Other embodiments, systems, methods, features, and advantages of the present invention will be, or will become, apparent to one having ordinary skill in the art upon examination of the following drawings and detailed description. It is intended that all such additional systems, methods, features, and advantages included within this description be within the scope of the present invention, and can be protected by the accompanying claims.

BRIEF DESCRIPTION OF THE DRAWINGS

The invention may be better understood with reference to the following drawings. The components in the drawings are not necessarily to scale, emphasis instead being placed upon illustrating the principles of the invention. In the drawings, like reference numbers designate corresponding parts throughout.

DETAILED DESCRIPTION

The following descriptions of detailed embodiments are for exemplifying the principles and advantages of the inventions claimed herein. They are not to be taken in any way as limitations on the scope of the inventions.

Figure 1:
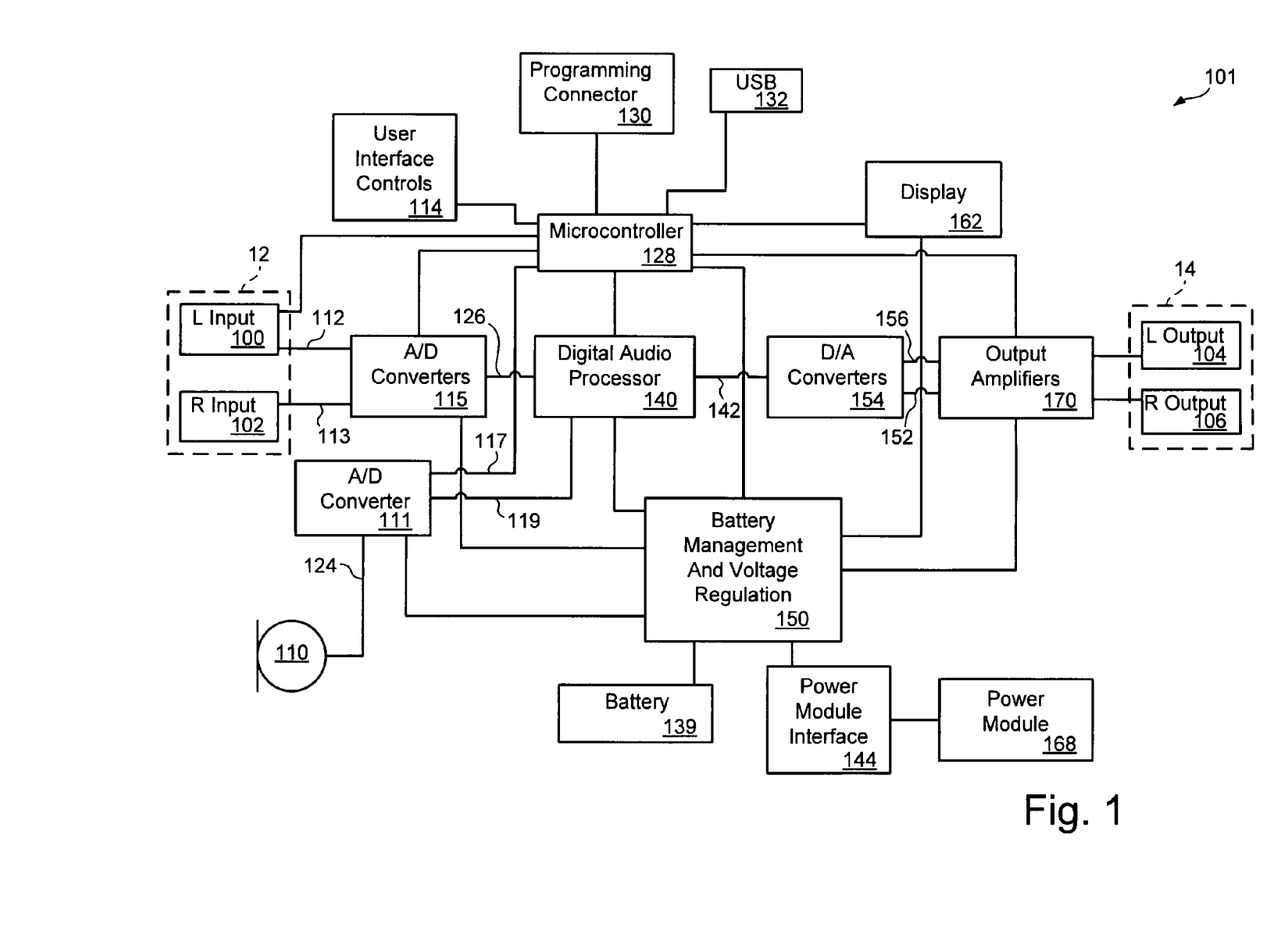
FIG. 1 is a simplified functional block diagram of an audio processor device in accordance with the present invention.

Turning to FIG. 1, a general functional block diagram is provided of an embodiment of a digital audio processor device 101 in accordance with the present invention. It should be appreciated that the functional blocks of FIG. 1 can be realized by any number of hardware and/or software components configured to perform the specified functions described herein. For example, the present invention can employ various integrated circuit components, e.g., memory elements, processing elements, logic elements, look-up tables, and the like, which can carry out a variety of functions under the control of one or more microprocessors or other control devices. Moreover, it should be appreciated that the interconnecting lines in FIG. 1 can be realized by any number of electrically conductive or other communication signal paths such as, but not limited to, electrically conductive wire(s), electrically conductive trace(s), wireless communication (including but not limited to BLUETOOTH), serial bus, parallel bus, or any combination thereof.

In FIG. 1, an audio input jack 12 is provided having a left input 100 and a right input 102 for receiving analog electrical input audio signals into the device 101. The inputs are electrically connected in a conventional manner to conventional analog-to-digital converters 115 having a digital electrical output 126 representative of the analog electrical inputs 112, 113. In an embodiment, dual 24-bit stereo multi-bit sigma-delta codecs are used having part number TLV320AIC23B.

Receiving the digital electrical signals 126 from the analog-to-digital converters 115 is a 48-bit digital audio processor 140 (e.g., part number TAS3103) having a processed output 142. Digital-to-analog converters 154 receive the processed signals 142 and produce analog electrical outputs 152, 156 responsive to the input 142. The analog outputs 152,156 are amplified by output amplifiers 170 wherein the amplified output is provided as electrical output audio signals to an output jack 14 having a left output 104 and a right output 106.

A conventional microcontroller 128 (e.g., part number MSP430F133) is electrically connected to the left input 100 of the input jack 12, the analog-to-digital converters 115, the output amplifiers 170, and the digital audio processor 140. Accordingly, the microcontroller 128 provides for monitoring the electrical input audio signals received at jack 12 and controlling the electrical output audio signals provided at jack 14 wherein the output audio signals are responsive, at least in part, to the input audio signals. Stated another way, the input audio signals have an effect on the audio output signals produced by the device 101.

The microcontroller 128 is also electrically coupled to a display 162 that, as explained in more detail further herein, displays the status of the device and audio level generated by headphones electrically connected to the output of the device. The microcontroller 128 determines the audio level based, in part, on the electrical signals received at the input jack 12 of the device and commands entered by a user via the user interface controls 114.

In addition to the user interface controls 114, a programming connector 130 and a USB connector 132 are electrically coupled to the microcontroller 128. The programming connector 130 provides for ease in coupling the microcontroller to a conventional device (not shown) for programming the microcontroller before final assembly of the device. Further, the USB connector 132 can be coupled to a Universal Serial Bus (not shown) wherein power from the bus can be used to charge the battery 139 contained within the device 101 and, in an embodiment, the device can communicate over the Universal Serial Bus. Alternatively, power to the connector 132 can be supplied from a conventional Universal Serial Bus charging unit (not shown). In an embodiment, but not necessarily, the battery 139 can be a conventional lithium-polymer rechargeable battery.

A microphone 110 is also provided for monitoring of environmental sounds with the device. The microphone 110 is electrically connected to an analog-to-digital converter 111 wherein analog signals from the microphone are converted into digital signals 119 that are received by the digital audio processor 140 to generate processed output signals 142. As indicated previously, the digital-to-analog converters 154 receive the processed signals 142 and produce analog electrical outputs 152,156 responsive to the processed signals 142. The analog outputs 152,156 are amplified by output amplifiers 170 wherein the amplified output is provided as electrical output audio signals to an output jack 14 having a left output 104 and a right output 106.

When the microphone 110 input is selected by a user via the user interface controls 114, the microcontroller 128 determines the input audio level based, in part, on the electrical signals produced by the microphone 110 in response to external or environmental audio signals received by the microphone. The microcontroller 128 controls the display for depicting the audio level generated by headphones electrically connected to the output of the device 101 wherein the audio level is based on commands entered by the user via the user interface controls 114 and the ambient audio level received by the microphone 110.

Also provided in the device 101 of FIG. 1 are a battery management and voltage regulator 150, a power module interface 114, and a power module 168 for controlling power distribution within the device 101. In addition, within the functional blocks shown in FIG. 1, the device provides a three-band equalizer, overload detection, sound level meter, and hearing safety monitor as described in detail further herein.

Figure 2:
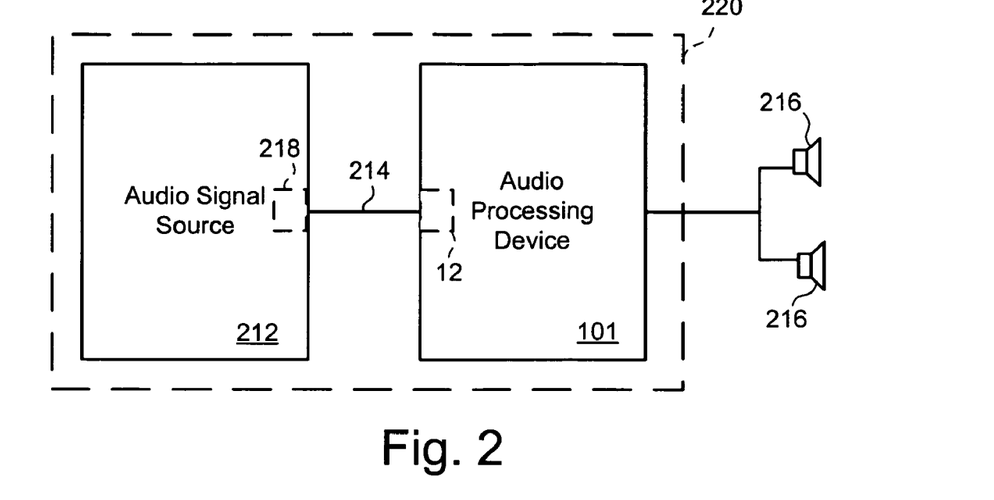
FIG. 2 is a simplified functional block diagram of the audio processor device of FIG. 1 connected to an audio source and earphones.

Turning to FIG. 2, a simplified functional block diagram is provided of the device of FIG. 1 connected to an audio source 212 and earphones 216. As in FIG. 1, it should be appreciated that the interconnecting lines in FIG. 2 can be realized by any number of electrically conductive or other communication signal paths such as, but not limited to, electrically conductive wires.

Moreover, the audio source 212 can be any conventional device having an audio output. For instance, but not necessarily, the audio source 212 can be a portable media player such as the iPod manufactured by Apple Inc. of Cupertino, Calif., which can play MP3, AAC/M4A, Protected AAC, AIFF, WAV, Audible audiobook files.

Preferably, but not necessarily, the audio output of the audio source 212 is a conventional earphone jack 218 wherein one end of an interconnect cable 214 is plugged into the earphone jack of the audio source and the other end of the cable is plugged into the input jack 12 of the audio processor 101.

The earphones 216 can be conventional in design. For instance, but not necessary, the earphones can be manufactured by one or more companies such as Etymotic Research under the model designation ER-4S, ER-4P, and ER-6i having a sensitivity of 108 dB/V, 120 dB/V, and 125 dB/V at 1 kHz, respectively. Further, but not necessary, the earphones can be manufactured by Shure under the model designation E2C, E3C, E4C, E5C, and E500 having a sensitivity of 123 dB/V, 129 dB/V, 124 dB/V, 132 dB/V at 1 kHz, respectively. Moreover, but not necessarily, the earphones can also be manufactured by Ultimate Ears under the model designation Super.fi3 studio, Super.fi5 Pro, and Super.fi5 EB having a sensitivity of 134 dB/V, 136 dB/V, and 136 dB/V at 1 kHz, respectively.

Figure 3:
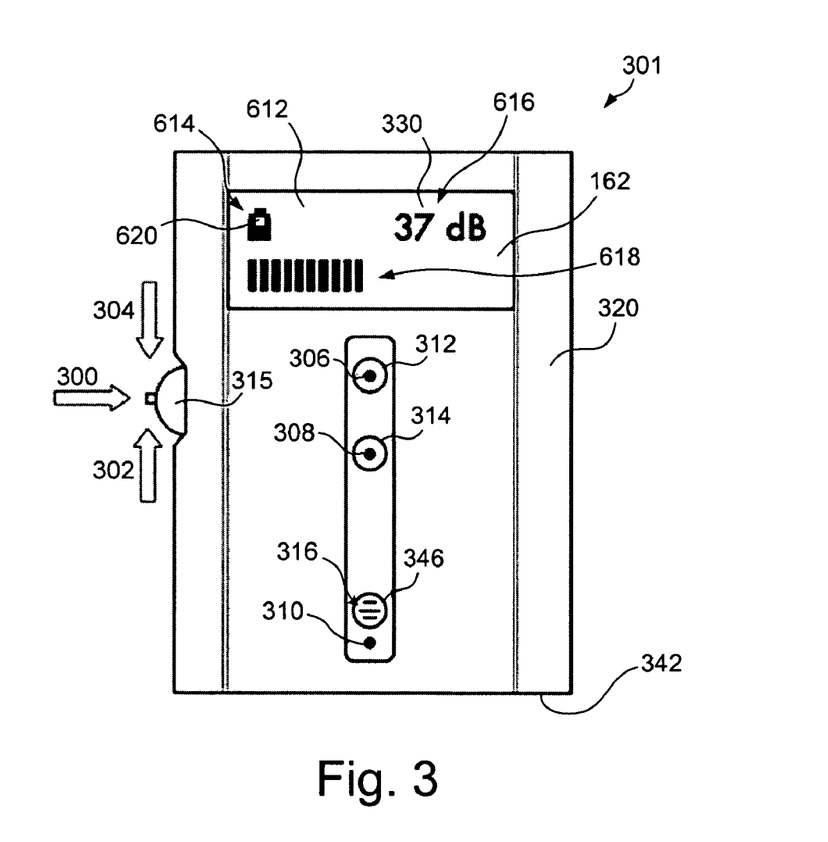
FIG. 3 is a plan view of an embodiment of an audio processor device incorporating the functionality of FIG. 1.

Turning to FIG. 3, a plan view is provided of an embodiment of a digital audio processor device 301 incorporating the functionality of FIG. 1. The device 301 includes an outer housing 320 constructed of a generally rigid plastic, metal, or metal alloy. The housing 320 also includes a select switch 315 and two buttons 312,314 as part of the user interface controls 114 of FIG. 1. In an embodiment, button 312 can be used to turn off and on device 301, enable the audio input 12, and also select audio functions of the device as described in detail further herein. Further, button 314 can be used to turn on and off device 301, enable the internal microphone 110 (FIG. 1), and also select audio functions of the device as described in detail further herein. Either or both the audio input 12 and microphone 110 can be selected at any time. However, if neither input is selected, then the device 301 will turn off.

In an embodiment, buttons 312 and 314 are constructed of a generally clear rigid plastic wherein light emitting diodes are mounted in proximity behind the buttons. Preferably, but not necessarily, a blue light emitting diode 306 is mounted in proximity behind button 312 and a red light emitting diode 308 is mounted in proximity behind button 314.

Switch 315 is a conventional switch for allowing the user to make selections as explained in detail further herein. In an embodiment, the switch 315 can be depressed in the direction of arrow 300 and rolled in the direction of arrows 302 and 304.

Visible through the housing 320 of the device 301 is the display 162 comprising a conventional liquid crystal display. In an embodiment, the housing 320 includes a generally clear rigid plastic window 330 mounted over the display 162 to protect it.

Located towards the bottom 342 of the housing 320 and extending through the housing are a plurality of slits 316. Mounted behind the slits 316 is a convention microphone 110 (FIG. 1). Preferably, but not necessarily, the slits 316 are located in a circular indentation 346 formed in the housing 320.

Also mounted about the indentation 346 in the housing 320 is a charge indicator 310 comprising a light emitting diode wherein the diode is controlled by regulator 150 (FIG. 1). In an embodiment, the charge indicator is a red light emitting diode that will illuminate when the charge cycle for the battery 139 begins and will extinguish when the charge cycle is complete.

Figure 4:
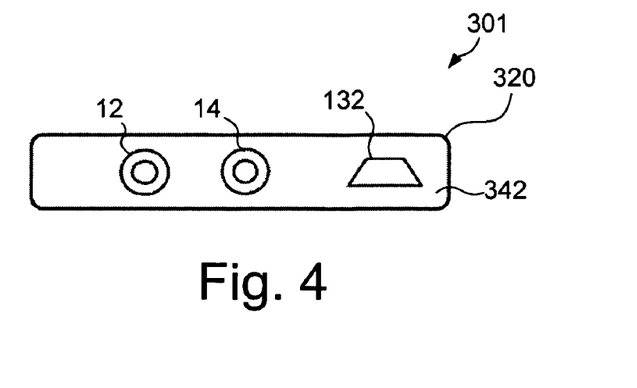
FIG. 4 is an elevation view of the bottom of the audio processor device of FIG. 3.

Turning to FIG. 4, an elevation view is provided of the bottom 342 of the housing 320 of the processor device 301. Preferably, but not necessarily, the bottom 342 includes the inputs and outputs associated with the device 301. In particular, the bottom 342 of the device 301 includes the audio signal input 12, the audio signal output 14, and the digital interface connection 132. As indicated previously, the audio signal input 12 can be, for example, a stereo jack for the connection of a stereo audio signal. The audio signal output 14 can be, for example, a stereo jack for the connection of earphones. In an embodiment, the digital interface connection 132 can provide for digital communication with an audio player, computer, or other digital device. This connection can, for example, be a Universal Serial Bus (USB) connection.

Turning back to FIG. 1, in operation a user enters into the digital audio processor device 101 a sensitivity level that represents the acoustic sensitivity of the earphones 216 (FIG. 2) the user will attach to the device. This setting is entered into the user interface controls 114 which is then entered into the flash memory of the microcontroller 128. A signal source 212 (FIG. 2), or optionally a stereo signal source, such as the earphone output 218 (FIG. 2) of a music player for example, is operatively connected to an audio processing device 101. As indicated previously, the signal source applied to the audio processing device 101 can be music, speech, or any other audio source that can be applied to an earphone. The analog-to-digital converter 115 receives the analog audio signal and converts it to a digital signal, which is then sent to the digital audio processor 140. The digital audio processor 140 queries the microcontroller 128 for the previously stored earphone sensitivity setting which is contained within the flash memory stage of the microcontroller 128. The digital audio processor 140 calculates the level being applied by the earphones by measuring the rms level of the audio stream and adding in a correction factor based on the stored earphone sensitivity level. This measurement is done while the audio stream passes through the digital audio processor 140 uninterrupted, allowing the user to ascertain the audio level while concurrently listening to the audio source(s). The digital audio processor 140 used within the device 101 passes the measured level information to the microcontroller 128 which then drives the display 162 to provide a bar graph indication and/or numerical indication.

Referring again to FIG. 1, as the digital audio processor 140 within the device 101 passes the audio level measurements to the microcontroller 128, the audio level is sampled and averaged resulting in a time-weighted measurement. The result of this time-weighted measurement can be stored in the flash memory on the microcontroller 128 as it is calculated for later summation and/or provided to the user via the display 162. When the time-weighted measurement exceeds a particular threshold, a warning or automatic gain reduction can be triggered by the microcontroller 128.

As indicated previously, a typical use of the device as shown in FIG. 1 includes applying an input from an audio source to the input channels 100 and 102, and attaching an earphone to the output channels 104 and 106. The analog audio signal stream from the external audio source is digitized by the A/D converter 115. The resulting digital stream is sent to the digital audio processor 140 where it is measured and selected processing functions are applied to the digital signal. For example, the signal can be filtered according to an equalization setting selected by the user, or a microphone input can be digitally added to the audio stream. Signal limiting, signal compression, frequency equalization, and digital delays and crossfeeds are also functions that can be processed by this stage, for example. Audio level information is passed from the digital audio processor 140 to the microcontroller 128. The signal is then fed from the digital audio processor 140 to the digital-to-analog converter 154. The digital-to-analog converter 154 transforms the digital audio stream into an analog audio signal to be fed to the output amplifier 170. The output amplifier 170 provides any amplification required and drives the output 104 and 106.

Continuing with FIG. 1, in an embodiment, the audio input to the device 101 is preset to provide a gain of +6 dB that may be adjusted. Further, the microphone output can be processed through an A-weighting filter. When the microphone 110 is on and the audio channel 12 is off, the display 162 will show the sound level in the environment as measured by the microphone. The levels can be shown in dBA SPL (A-weighted sound pressure level in dB)

Turning to FIG. 3, as previously indicated the device 301 includes the housing 320, the display 162, and the user controls 312, 314, and 315. The user controls 312 and 314 are switches, in the form of buttons, which allow the user to selectively engage or disengage the audio and microphone inputs. Integrated within the user controls 312 and 314 are indicators 306 and 308 which visibly display the status of the controls. Indicators 306 and 308 can be, for example, light-emitting-diodes (LEDs) which can be seen through a transparent portion of the controls 312 and 314. Another aspect of the present invention is the microphone 110 (FIG. 1), which is contained within the housing 320. Control 315 allows the user to navigate the user interface which is selectively shown on the display 162. The user can actuate the control 315 in the down direction 304 to navigate in one direction through the user interface, in the up direction 302 to navigate in the other direction, or the user can press the control 315 inwards 300 towards the housing 320 in order to make a selection in the user interface. Accordingly, display 162 shows various menu selections and visual indicators, depending on the functions selected by the user and the status of the user controls 312, 314, and 315.

In an embodiment, as shown in FIG. 3, the main screen 612 presented on the display 162 depicts a battery condition indicator 614, the audio level indicator 616 in dB SPL and a graphical display 618 of the audio level. The battery condition indicator 614 depicts the approximate amount of life in the battery 139 (FIG. 1) wherein the unfilled area 620 of the indicator enlarges as the battery charge depletes.

The audio level indicator 616 indicates, with a number, the approximate audio level being reproduced by the earphones 216. The number indicates the level of the audio from the audio input 12 and the microphone 110, depending on which source(s) is active.

The graphical display 618 can be a bar graph that moves from left to right, indicating the listening level in dB SPL in 3 dB steps. In an embodiment, if the bar graph reaches the far right a "+" sign appears indicating that the output is at or near clipping.

As indicated previously, there are several user-adjustable settings in the device 301. These can be accessed by pressing the menu select switch 315 directly inwards (i.e., in the direction of arrow 300). Once the menu is accessed, the user can scroll through the selections by rolling upward 302 or downward 304 on the select switch 315. On the menu screens the setting can be changed using the audio button 312 and microphone button 314 on the front of the device. When the user is finished making changes to a setting, rolling upward or downward on the select switch 315 moves to the next setting. The settings are saved in the memory of the microcontroller 128 (FIG. 1). The user can exit the settings menu by waiting a short time (e.g., three seconds) for the menu to automatically time out or by pushing in on the select switch 315.

As indicated previously, the device 301 includes a three-band parametric equalizer that can be used to provide a customized frequency response. The adjustable bands include a low-frequency (bass), mid-frequency, and high-frequency (treble) setting. These filters can be adjusted as to frequency and level for each band.

Figure 6:
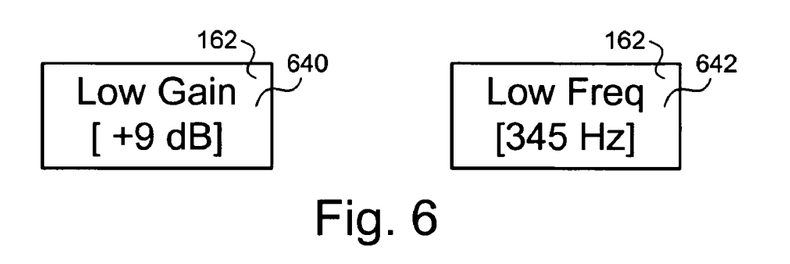
FIGS. 6-12 depict various menu screens that can be presented on the display of the digital audio processor device of FIG. 3.

Turning to FIG. 6, the low gain setting in menu 640 allows the user to adjust the gain of the low frequency band of the equalizer. In an embodiment, it is adjustable from +9 to −9 dB in 1 dB steps. The low frequency setting in menu 642 allows the user to adjust the corner point of the low frequency filter. In an embodiment, the frequency options are 110 Hz, 220 Hz, and 345 Hz.

Figure 7:
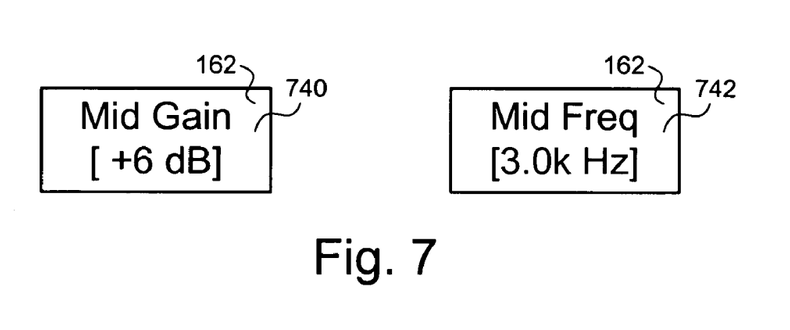

Turning to FIG. 7, the mid gain setting in menu 740 allows the user to adjust the gain of the mid frequency band of the equalizer. In an embodiment, it is adjustable from +6 to −6 db in 3 dB steps. The mid frequency setting in menu 742 allows the user to adjust the mid point of the mid-frequency filter. In an embodiment, the frequency options are 2.0 kHz, 2.5 kHz, and 3.0 kHz.

Figure 8:
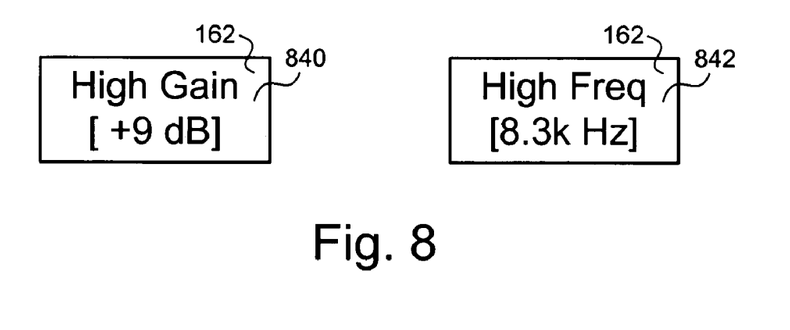

Turning to FIG. 8, the high gain feature in menu 840 allows the user to adjust the gain of the high frequency band of the equalizer. In an embodiment, it is adjustable from +9 to −9 dB in 1 dB steps. The high frequency setting in menu 842 allows the user to adjust the corner point of the high-frequency filter. In an embodiment, the frequency options are 2.8 kHz, 5.5 kHz, and 8.3 kHz.

Figure 9:
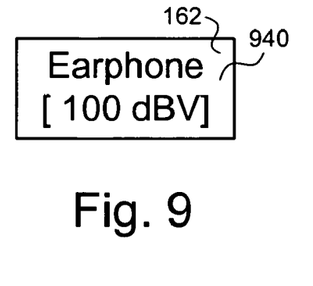

Turning to FIG. 9, the earphone sensitivity setting in menu 940 indicates the value that corresponds to the type of earphone the user is using with the device 301. Desirably, the setting is adjusted by the user to match the sensitivity of the user's earphones.

Figure 10:
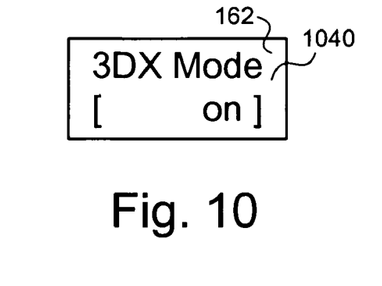

Turning to FIG. 10, the 3DX soundfield expansion mode provides an enhanced listening environment, simulating the environment of listening to music through a pair of stereo speakers. When in a typical listening environment, in front of a pair of stereo speakers, both ears will hear the sound from both speakers. However, with earphones a person loses this ability and only the signal coming from each earphone is heard in each corresponding ear. As such, earphones cause the normal "crossfeed" to be lost. The 3DX feature attempts to recreate the experience of listening to sounds as if the user is in front of a pair of speakers. This feature and its implementation are well known to those having skill in the art. Through menu 1040, the user can enable and disable the feature.

Figure 11:
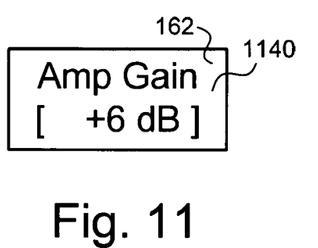

Turning to FIG. 11, a menu 1140 is provided wherein the voltage gain of the audio channel can be adjusted by the user from −20 dB to +20 dB. In an embodiment, the default setting is +6 dB.

Figure 12:
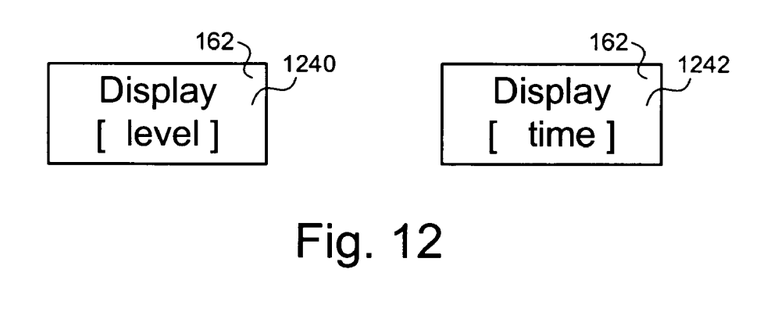

Turning to FIG. 12, a display setting menu is provided wherein the setting can be toggled by a user between selecting either level 1240 or time 1242. When "level" is selected, the display 162 will show the sound level in the user's ear. When "time" is selected, the display 162 will shown an estimate of the length of time the user could listen at a sound level before risking hearing damage due to the intensity of the sound. In an embodiment, the time is indicated in minutes that it is relatively safe to listen at the given sound level for a 24 hour period based on the National Institute for Occupational Safety and Health (NIOSH) workplace limits.

Figure 13:
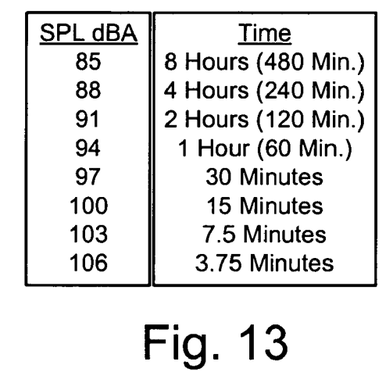
FIG. 13 is a chart depicting the recommended maximum exposure time to various sound levels; and, FIGS. 14 and 15 are block diagrams depicting a method wherein the sensitivity of earphones can be subjectively determined.

Turning to FIG. 13, a chart adapted from NIOSH 98-126, incorporated herein by reference, is depicted wherein the time indicated by the device 301 that it is safe to listen at a given sound level is derived therefrom. Accordingly, the device 301 provides the user with information to make safe choices about the level and the amount of time at which to listen to a given sound level. Preferably, once the user has set his or her earphone sensitivity in the device 301, both the levels and time shown on the display are based on the levels being produced in the ears of the user. However, it is recognized that typically only an estimate can be provided of the sound level since earphones are manufactured within various tolerances levels determined by the manufacturer.

Figure 5:
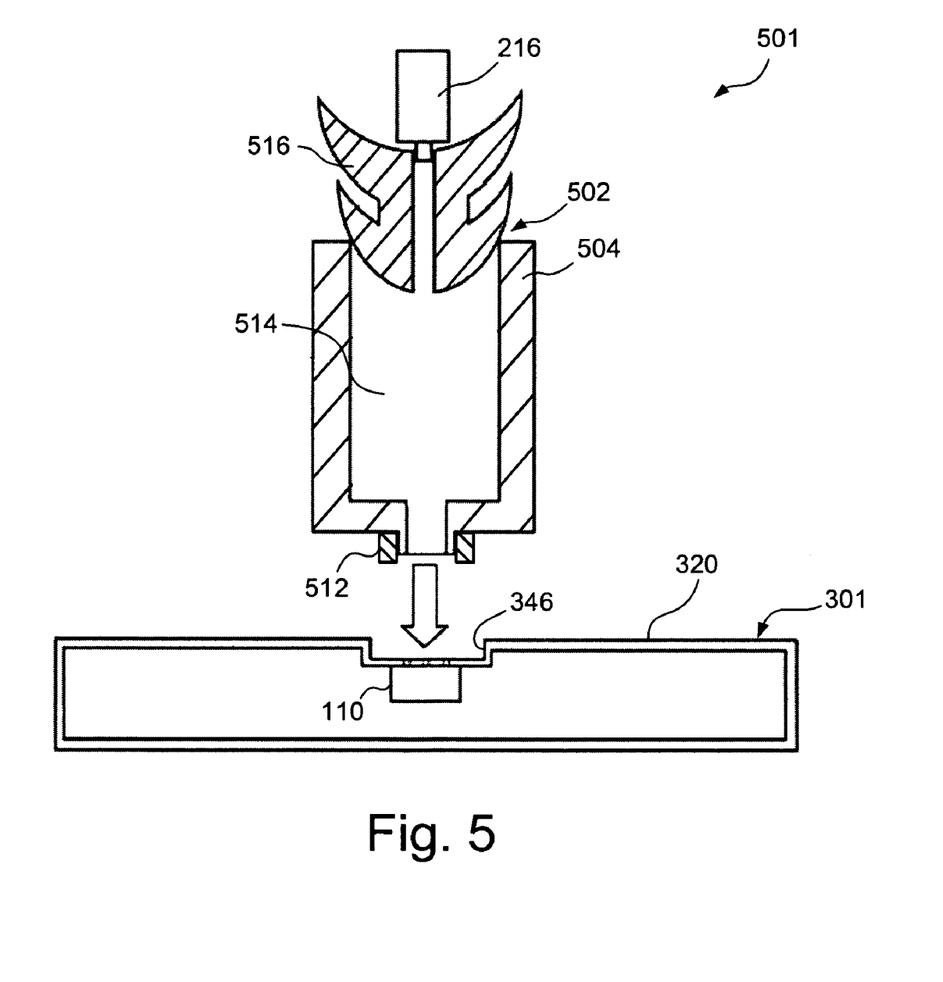
FIG. 5 is a partial cross sectional view of an earphone calibration system in accordance with the present invention wherein an earphone is mounted to the audio processor device of FIG. 3.

Turning to FIG. 5, a partial cross sectional view of an earphone calibration system in accordance with the present invention is provided wherein an earphone is mounted to the device of FIG. 3. The calibration system 501 includes a generally cylindrical earphone coupler 504 having a known inner volume 514 and known acoustic properties. The earphone coupler 504 which for example, can be removable or can be an integral part of the housing 320 of the digital audio processor 301, is attached to the processor 301 via an annular sealing portion 512 which can or can not be compliant. This sealing member 512 can be made, for example, to snap into the recess 346 in the housing 320 of the digital audio processor 301. With this system 501, an earphone 216 can be actively calibrated using the integrated microphone 110 in the digital audio processor 301. The earphone 216 with its compliant eartip 516 to be calibrated is proximately sealed into the open end 502 of the earphone coupler 504. A wide-band audio chirp, frequency sweep, tone, or other known audio signal can be applied to the earphone 216, via device output 14 (FIG. 1), and the resultant audio output of the earphone measured by the microphone 110. The digital audio processor device 301 receives the signal from the microphone 110 and can store the response in memory or use the response to calibrate the output 14 of the device 301. As will be appreciated by those having ordinary skill in the art, this calibration system can also use an external microphone connected to the digital audio processor 301 via an external connection such as, but not limited to, an input for the external microphone.

In an alternative embodiment, headphone sensitivity can be determined using both the headphone and the sound level received by microphone 110. In particular, in this embodiment, the user inserts an earphone into only one ear canal while the other ear canal remains unobstructed. Next, the audio processor 301 generates a sound level in the ear canal of the user, via the inserted earphone, wherein the sound level is based upon the electrical signals 124 (FIG. 1) generated by the microphone 110. As such, the user adjusts the volume control of the microphone until the perceived sound level in both ears match. Accordingly, as will be appreciated by those having ordinary skill in the art, the sensitivity of the earphone can be determined based on the electrical signals 124 generated by the microphone and the signal strength required to make the earphone sound level match the environmental sound level perceived by the user.

Figure 14:
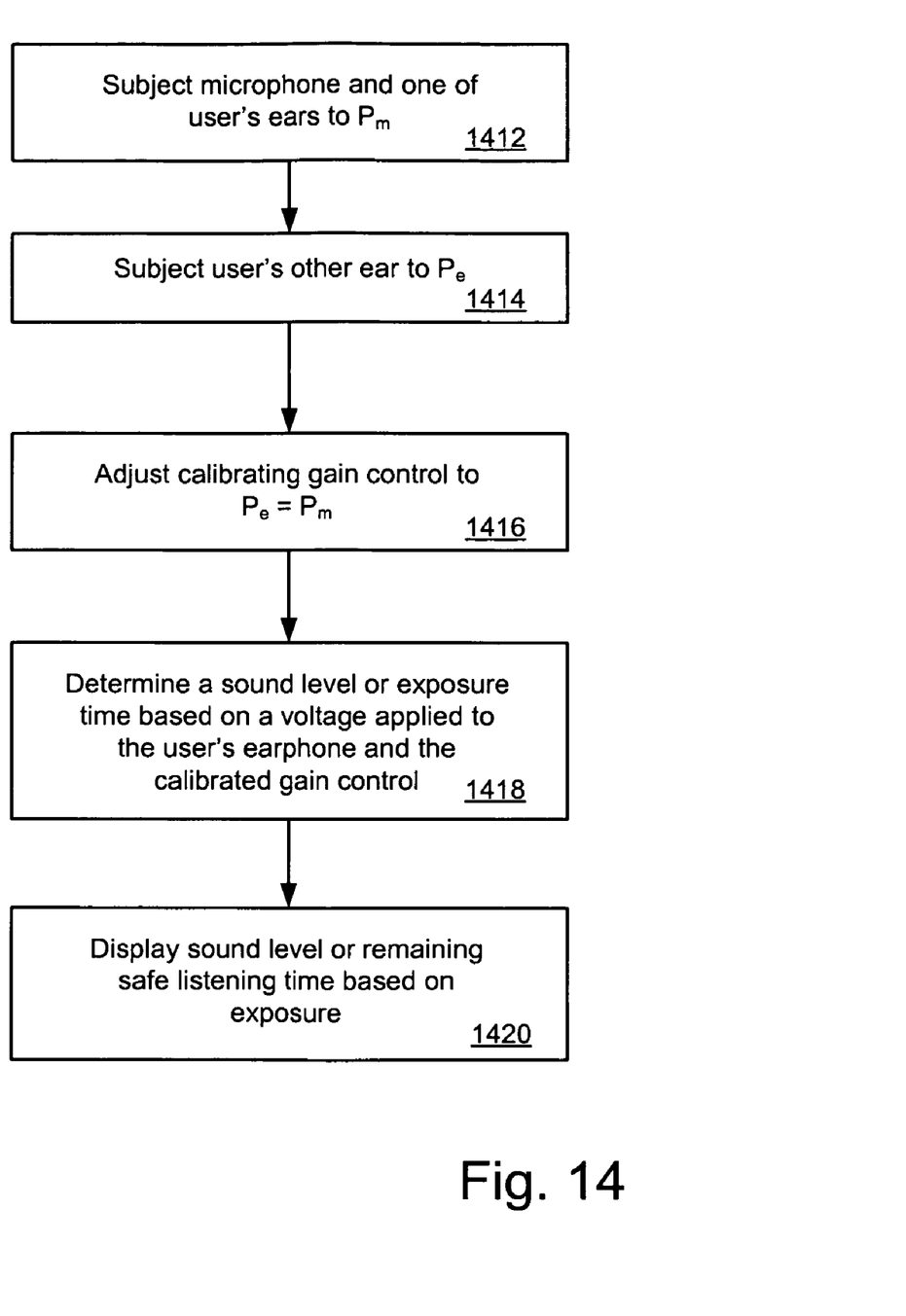
Figure 15:
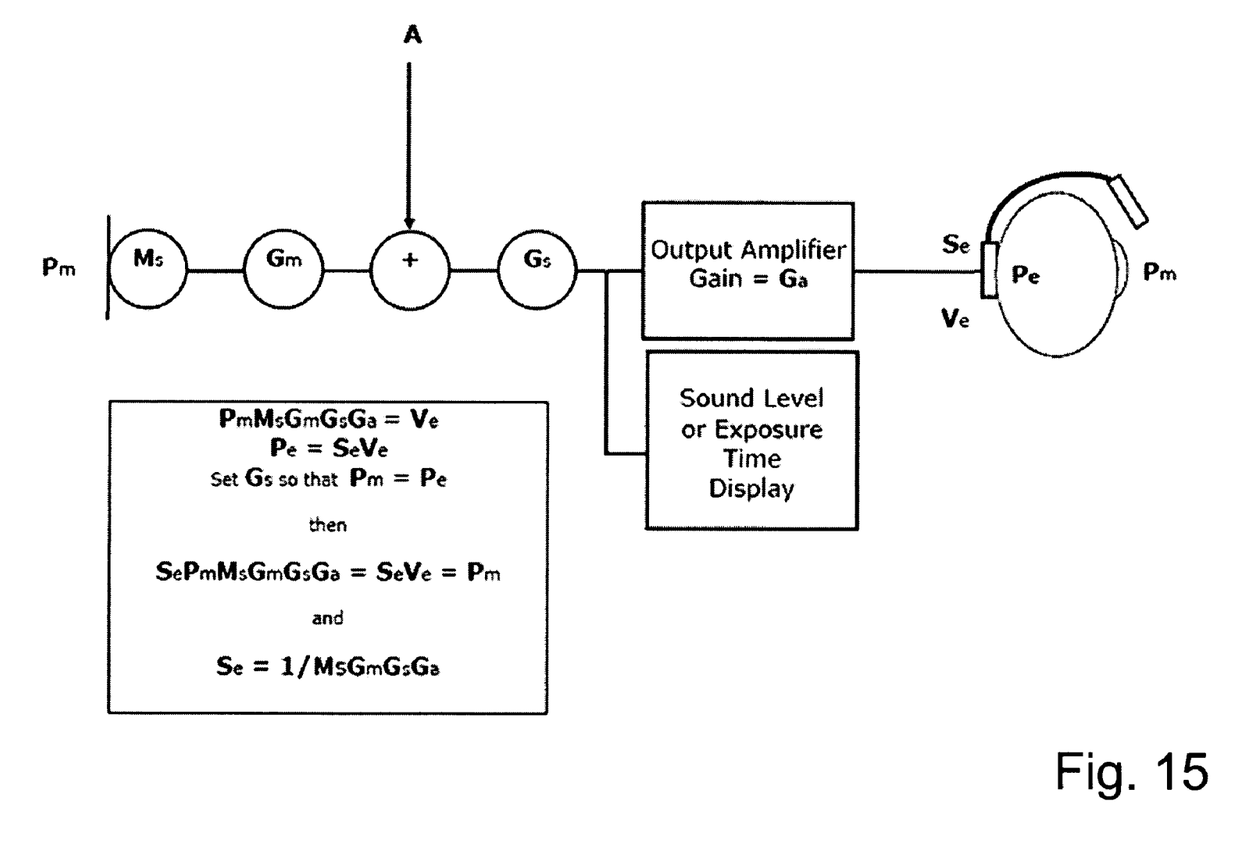

Turning to FIGS. 14 and 15, a block diagrams are provided depicting the method wherein the sensitivity of earphones can be subjectively determined by a user. In block 1412 of FIG. 14, the device 101 (FIG. 1) is set in a calibration mode where $P_m$ represents an arbitrary sound pressure level to which the integral microphone and a user's uncovered ear are exposed. In block 1414, $P_e$ represents the reproduced sound pressure level at the user's other ear due to the combined effects of sound pressure level $P_m$, the microphone sensitivity $M_s$ (in volts/sound pressure level), a reference gain setting Gm, an adjustable gain setting $G_s$, the output amplifier gain $G_a$, and the sensitivity of the user's earphones $S_e$ (in sound pressure level/volts). In block 1416, if the user adjusts the calibration gain control $G_s$ such that equal sound pressure levels are perceived in each ear, $P_e$ is then equal to $P_m$. Under these conditions, the sensitivity of the earphones are a function of the microphone sensitivity and the identified gain settings. In block 1418, by noting these values the sound level or exposure time display can be calibrated to read the correct sound pressure level or safe exposure time for a given voltage applied to the user's earphones. Accordingly, in block 1420, once calibrated using this procedure, the sound pressure level or safe listening time associated with an audio source 212

(FIG. 2), microphone 110 (FIG. 1), or any combination of the two can be displayed on display 162 (FIG. 1).

Turning back to FIG. 2, in an embodiment, the audio signal source 212 and the audio processing device 101 can be attached to each other using conventional hook and loop fasteners such as, but not limited to, VELCRO. Alternatively, the functionality of the audio signal source 212 and the audio processing device 101 can be combined into a single device 220.

It should be emphasized that the above-described embodiments of the present invention, particularly, any "preferred" embodiments, are possible examples of implementations merely set forth for a clear understanding of the principles for the invention. Many variations and modifications may be made to the above-described embodiment(s) of the invention without substantially departing from the spirit and principles of the invention. All such modifications are intended to be included herein within the scope of this disclosure and the present invention, and protected by the following claims.

What is claimed is:

1. An audio processor comprising:
   a housing;
   a display;
   an audio input jack extending into the housing;
   an earphone jack extending into the housing and providing an electrical output signal responsive to an electrical input signal received by the audio input jack;
   wherein the display indicates a sound level based, at least in part, on the electrical input signal received by the audio input jack and representative of audio levels presented within a human ear canal by an earphone or headphone connected to the earphone output; and,
   wherein the audio levels are determined based, in part, on a sensitivity value of the earphone or headphone that is recalled from a memory contained within the housing, entered manually by a user, or determined by calibration.

2. The audio processor of claim 1 further comprising a user interface wherein the response of the electrical output signal can be customized via a headphone amplifier.

3. The audio processor of claim 1 further comprising a user interface wherein the response of the electrical output signal can be customized via an equalizer.

4. The audio processor of claim 1 further comprising an ambient monitoring microphone mounted within the housing and having an electrical output.

5. The audio processor of claim 4 wherein the electrical output of the microphone is mixed with the electrical input signal received by the audio input jack.

6. The audio processor of claim 4 wherein a sound level meter is provided on the display.

7. The audio processor of claim 6 wherein the sound level meter depicts sound levels associated with listening to live and recorded audio signals.

8. The audio processor of claim 1 wherein the display indicates a recommended maximum time that a user can safely listen to the earphone or headphone at the sound level based on a recommendation such as NIOSH 98-126.

9. The audio processor of claim 1 further comprising a battery system contained within the housing for supplying power to the audio processor.

10. The audio processor of claim 1 wherein the sound level displayed relates to that generated by noise-isolating earphones or headphones.

11. The audio processor of claim 1 wherein the sound level displayed relates to that generated by insert-earphones.

12. The audio processor of claim 1 wherein the sound level displayed relates to the sensitivity of the earphones.

13. The audio processor of claim 1 wherein the display indicates a recommended maximum number of minutes that a user should listen to the earphone or headphone at the sound level.

14. The audio processor of claim 1 wherein the input jack is electrically coupled to an MP3 audio source.

15. The audio processor of claim 1 further comprising a microphone wherein the display indicates a sound level received by the microphone.

16. The audio processor of claim 1 wherein a sensitivity or frequency response profile of the earphone or headphone is stored in memory with a sensitivity or frequency response profile for another earphone or headphone.

17. An apparatus comprising:
    a display an earphone output providing an electrical output signal responsive to an electrical input signal generated in response to playing an audio file;
    wherein the display indicates a sound level based, at least in part, on the electrical input signal and representative of audio levels presented within a human ear canal by an earphone or headphone connected to the earphone output; and,
    wherein the audio levels are determined based, in part, on a sensitivity of the earphone or headphone that is recalled from a memory contained within the housing, entered manually by a user, or determined by calibration.

18. The apparatus of claim 17 wherein the sound level displayed relates to the sensitivity of the earphones or headphones.

19. The apparatus of claim 17 wherein the display indicates a recommended maximum time that a user can safely listen to the earphone or headphone at the sound level.

20. The apparatus of claim 17 wherein the display indicates the cumulative audio exposure level that a user has received listening to the earphone or headphone relative to a recommended safe daily exposure limit.

21. The apparatus of claim 17 wherein the audio file is an MP3.

22. The apparatus of claim 21 wherein an audio source and the display are contained within a single housing.

23. The apparatus of claim 17 further comprising a microphone wherein the display indicates a sound level received by the microphone.

24. The apparatus of claim 23 wherein the microphone receives a signal from the earphone to determine a the sensitivity associated with the earphone.

25. The apparatus of claim 23 wherein the sound level received by the microphone is used to determine a the sensitivity associated with the earphone.

26. The apparatus of claim 17 wherein a the sensitivity or frequency response profile of the earphone or headphone is stored in the memory is also stored with a sensitivity or frequency response profile for another earphone or headphone.

27. A method comprising the steps of:
    receiving an electrical input signal;
    generating an electrical output signal in response to the electrical input signal;
    reproducing the electrical output signal with an earphone or headphone; as
    displaying a sound level based, at least in part, on the electrical input signal and representative of audio levels presented within a human ear canal by the earphone or headphones and determining a sensitivity of the earphone or headphone utilizing electrical signals generated by a microphone.

28. The method of claim 27 further comprising the step of displaying the recommended maximum amount of time that a user should listen to the earphone or headphone at the sound level.

29. The method of claim 27 further comprising the step of displaying a sound level received by the microphone.

30. A method comprising the steps of:
receiving an electrical input signal;
generating an electrical output signal in response to the electrical input signal;
receiving the electrical output signal with an earphone or headphone
generating an acoustic calibration signal with the earphone or headphone in response to the received electrical output signal;
receiving the acoustic calibration signal with a microphone to generate a calibration response signal; and,
determining the sensitivity or frequency response of the earphone or headphone based, at least in part, on the calibration response signal.

31. The method of claim 30 further comprising the step of coupling the earphone or headphone to the microphone with an acoustical coupling volume.

32. The method of claim 31 wherein the step of generating an acoustic calibration signal includes generating a tone, chirp, or frequency sweep.

33. The method of claim 31 wherein the acoustical coupling volume is integral to a housing containing the microphone.

34. An apparatus comprising:
a display;
an earphone output providing an electrical output signal responsive to an electrical input signal generated in response to playing an audio file; and
an audio processor having an output based, at least in part, on the electrical input signal and representative of audio levels presented within a human ear canal by an earphone or headphone connected to the earphone output; and,
wherein the audio levels are determined based, in part, on a sensitivity value of the earphone or headphone that is recalled from a memory, entered manually by a user, or determined by calibration.

35. The apparatus of claim 34 further comprising a display indicating a recommended maximum number of minutes that a user should listen to the earphone or headphone at the audio level.

36. The apparatus of claim 34 further comprising a display indicating a cumulative audio exposure level that a user has received listening to the earphone or headphone, relative to a recommended safe daily exposure limit.

37. The apparatus of claim 34 wherein the earphone electrical output signal is limited to a preset safe level based, at least in part, on a the sensitivity associated with the earphone or headphone.

38. The apparatus of claim 34 wherein the audio file is digitally encoded.

39. The apparatus of claim 34 further comprising a housing containing the display and an audio source.

40. The apparatus of claim 34 further comprising a microphone wherein the display indicates the audio levels presented within the human ear.

41. The apparatus of claim 40 wherein the microphone receives a signal from the earphone to determine a the sensitivity associated with the earphone.

42. A method comprising the steps of:
subjecting a microphone and one ear of a user to an outside sound pressure;
generating a sound pressure in another ear of the user;
adjusting a gain to a level wherein the outside sound pressure approximately equals the generated sound pressure;
determining the sound pressure level generated by an earphone or a headphone based, at least in part, on the adjusted gain level; and,
displaying the sound pressure level.

43. The method of claim 42 further comprising the step of determining the sensitivity of the earphone or headphone.

44. The method of claim 42 further comprising the step of displaying the recommended maximum amount of time that the user should listen to the earphone or headphone at the sound pressure level.

* * * * *